(12) United States Patent
Akulova et al.

(10) Patent No.: US 6,819,695 B1
(45) Date of Patent: Nov. 16, 2004

(54) DOPANT DIFFUSION BARRIER LAYER FOR USE IN III-V STRUCTURES

(75) Inventors: Yuliya Anatolyevna Akulova, Allentown, PA (US); Michael Geva, Allentown, PA (US); Abdallah Ougazzaden, Emmaus, PA (US)

(73) Assignee: TriQuint Technology Holding Co, Hillsboro, OR (US)

( * ) Notice: Subject to any disclaimer, the term of this patent is extended or adjusted under 35 U.S.C. 154(b) by 0 days.

(21) Appl. No.: 09/540,471

(22) Filed: Mar. 31, 2000

Related U.S. Application Data

(60) Provisional application No. 60/175,010, filed on Jan. 7, 2000.

(51) Int. Cl.[7] .................................................. H01S 5/00
(52) U.S. Cl. .............................. 372/45; 372/46; 372/50; 257/25
(58) Field of Search ............................. 372/45, 46, 43, 372/50; 257/25, 101, 194, 94, 95; 438/29, 41, 47

(56) References Cited

U.S. PATENT DOCUMENTS

| | | | | |
|---|---|---|---|---|
| 5,012,477 A | * | 4/1991 | Mesquida et al. | ............ 372/50 |
| 5,212,705 A | * | 5/1993 | Kahen et al. | ................. 372/46 |
| 5,319,657 A | * | 6/1994 | Otsuka et al. | ................ 372/43 |
| 5,723,872 A | * | 3/1998 | Seabaugh et al. | ............. 257/25 |
| 5,796,127 A | * | 8/1998 | Hayafuji et al. | ............ 257/194 |
| 5,801,404 A | * | 9/1998 | Kahen et al. | ................ 257/101 |
| 6,011,811 A | * | 1/2000 | Ohlander et al. | ............. 372/46 |
| 6,110,756 A | * | 8/2000 | Otsuka et al. | ................ 438/41 |
| 6,221,684 B1 | * | 4/2001 | Sugawara et al. | ............ 438/47 |
| 6,222,208 B1 | * | 4/2001 | Ogihara et al. | ............. 257/101 |
| 6,222,865 B1 | * | 4/2001 | Stoltz et al. | ................... 372/45 |
| 6,240,114 B1 | * | 5/2001 | Anselm et al. | ................ 372/45 |
| 6,285,697 B1 | * | 9/2001 | Landwehr et al. | ............ 372/45 |
| 6,399,407 B1 | * | 6/2002 | O'Brien et al. | ............... 438/29 |
| 6,403,874 B1 | * | 6/2002 | Shakouri et al. | ............ 136/201 |

FOREIGN PATENT DOCUMENTS

| WO | WO 97/50133 | 12/1997 | ........... H01L/33/00 |

OTHER PUBLICATIONS

European Standard Search Report—Dated: Nov. 2, 2001.

\* cited by examiner

*Primary Examiner*—Hoanganh Le
*Assistant Examiner*—Jimmy T. Vu

(57) ABSTRACT

A multi-layer dopant diffusion barrier is disclosed that effectively prevents dopant diffusion but does not contribute to parasitic pn junctions or parasitic capacitance. A multi-layer dopant diffusion barrier layer prevents dopant diffusion.

20 Claims, 1 Drawing Sheet

DOPANT DIFFUSION BARRIER LAYER FOR USE IN III-V STRUCTURES

CROSS-REFRERNCE TO RELATED APPLICATIONS

This present application claims priority of Provisional Application Ser. No. 60/175,010 file Jan. 7, 2000. The present application is also related to U.S. patent application Ser. No. 09/539,882 and 60/175,009 filed on even date herewith and assigned to the assignee of the present invention. The disclosures of the above captioned patent applications are specifically incorporated herein by reference.

FIELD OF THE INVENTION

The present invention relates to a dual layer dopant diffusion barrier for use in III-V semiconductor structures.

BACKGROUND OF THE INVENTION

One typical structure employed in optoelectronic devices is the p-i-n (PIN) structure. In a typical PIN structure, an intrinsic layer is disposed between a p-type layer and a n-type layer, forming a heterostructure device. The intrinsic layer has a larger index of refraction than the p and n layers resulting in a natural waveguide. Furthermore, the energy band discontinuities in the conduction and valence bands in the PIN structure facilitate carrier confinement within the active layer. In short, the PIN structure is well suited for a variety of emitting and detecting optoelectronic device applications.

One material that is often used in optoelectronics devices is indium phosphide (InP). In a PIN structure employing InP, a p-type layer is often fabricated by introducing zinc as a dopant. While zinc is a suitable dopant for forming p-type layer, zinc can readily diffuse due to the higher temperature achieved during the growth of InP. Diffusion into the active (intrinsic layer in a PINstructure) layer can occur resulting in the undesired doping of the active layer. This can have deleterious effects. For example, in a laser, intra-band transitions can occur, resulting in optical losses and reduced output power. Furthermore, the unintentional doping of the active layer can result in a shift in the emitted wavelength of an emitter. In applications where the PIN structure is used as an electro-absorptive modulator, zinc dopants in the active layer can change the absorption edge thereby degrading the extinction ratio.

One typical InP based structure used often in optoelectronic devices is a mesa structure having current blocking layers on either side of the mesa which provide transverse optical and carrier confinement. In many structures, one or more of the current blocking layers is iron doped indium phosphide (InP(Fe)). Unfortunately, inter-diffusion of p-dopants from the p-type layer and iron from the semi-insulating InP(Fe) layer is a common occurrence. This inter-diffusion may have detrimental effects on device characteristics. For example, the diffusion of the p-type dopants can readily result in leakage current in the device, and the inter-diffusion of the iron into the p-type layer results in its becoming more resistive. Accordingly, it is desirable to have a barrier layer to prevent the inter-diffusion.

An n-InP layer can be used as a dopant barrier layer. This type of barrier layer can be used to prevent dopant diffusion out of the p-cladding layer and into the active layer of a PIN device. Moreover, the n-InP layer can be used to prevent inter-diffusion of iron dopants and p-type dopants in a buried mesa structure device.

In the former case, where the n-InP layer is used to prevent diffusion of p-type dopants from the p-type layer, the n-type InP layer is disposed between the p-type layer and the active layer of the PIN device. While the n-InP layer prevents p-type dopants diffusion, it unfortunately forms an undesired pn junction is formed in the p-type layer. This parasitic pn junction may degrade device performance. Clearly, this is an undesired side affect of the use of an n-type InP diffusion blocking layer.

In the latter case, where the n-type in P diffusion barrier layer is used along the side of the mesa to prevent inter-diffusion of iron and p-type dopants, a relatively high concentration of n-type dopants (on the order to $10^{18}$ atoms/$cm^3$) must be used to prevent p-type diffusion. Moreover, to ensure appropriate blocking of the dopants, it is necessary to make this layer relatively thick. Accordingly, a parasitic pn junction is established between the p-type cladding layer and n-type dopant diffusion blocking layer. This can cause an undesired current leakage path. Moreover, the disposition of the n-type diffusion barrier layer between the p-type cladding layer and the current blocking layer to prevent inter-diffusion can result in an increased parasitic capacitance. This can have deleterious effects on devices. This is particularly problematic in devices such as electro-absorptive modulators, lasers and digital devices in general as it adversely impacts device speed.

Accordingly, what is needed is a dopant diffusion barrier layer which successfully blocks diffusion of dopants, while not introducing parasitic elements to the device.

SUMMARY OF THE INVENTION

A multi-layer dopant diffusion barrier layer is disposed between a doped layer and another layer. The dual layer dopant diffusion barrier prevents inter-diffusion of dopants between the doped layer and the other layer. In one embodiment, this dual layer is used in conjunction with a dopant diffusion barrier layer that prevents diffusion of dopants from diffusing out of a doped layer into an intrinsic layer, without creating a p-n junction in the doped layer.

BRIEF DESCRIPTION OF THE DRAWING

The invention is best understood from the following detailed description when read with the accompanying drawing figures. It is emphasized that in accordance with the standard practice in the semiconductor industry the various features are not drawn to scale. In fact, the dimensions of the various features may be arbitrarily increased or reduced for clarity of discussion.

DETAILED DESCRIPTION OF THE INVENTION

Figure 1:
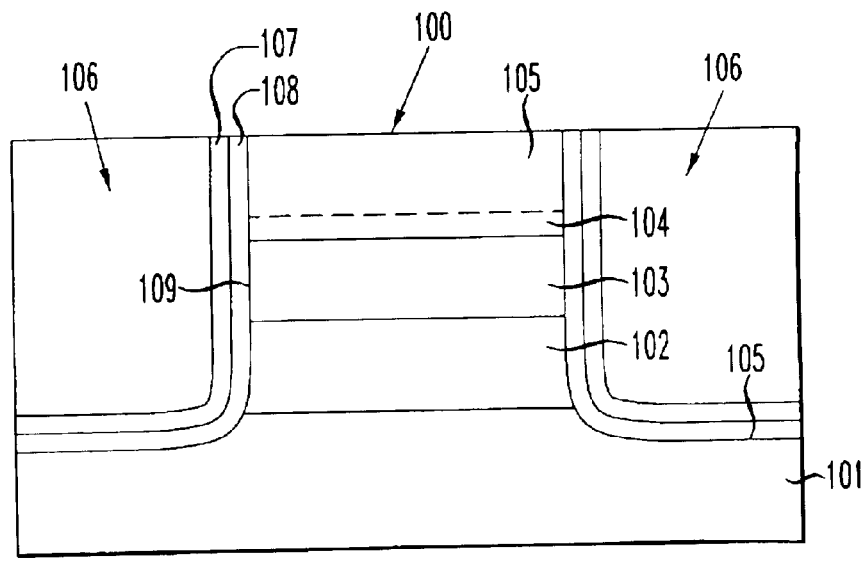
FIG. 1 is a cross sectional view of the dopant diffusion barrier layer in an exemplary embodiment of the present invention.

The invention can be understood generally from a review of FIG. 1. A first doped layer 102, an intrinsic layer 103, a diffusion barrier blocking layer 104, a second doped layer 105, and current blocking layers 106 are disposed above a substrate 101. The multi-layer inter-diffusion barrier layer 109 includes layers 107 and 108. The inter-diffusion barrier layer is illustratively a dual layer, with one layer blocking diffusion of dopants from the current blocking layer 106, and the other layer for blocking diffusion of dopants from a layer of the mesa structure 100, for example, the layer 105. Illustratively, the mesa structure 100 is a PIN device. The p-type layer is shown at 105, and the active layer 103 is intrinsic semiconductor disposed over the n-type layer 102. Dopant diffusion barrier layer 104 is disposed between the p-type layer 105 and the active layer 103. Layer 104 prevents dopants from the p-type layer 105 from diffusing into the active layer 103. The material chosen for layer 104 does not form a pn junction with the p-type layer 105. The material chosen for layer 108 is illustratively the same as that chosen for layer 104, and serves the same function as layer 104 by preventing dopants from diffusing out of layer 105 into the barrier layer 106. Again, this layer 108 does not form a pn junction with layer 105. Layer 107 prevents diffusion of dopants out of the current barrier layer 106, but does not add parasitic capacitance nor a parasitic pn junction.

Illustratively, the substrate 101 is semi-insulating InP. The n-type layer 102 is illustratively an n-InP, with an active layer 103 of intrinsic InGaAsP disposed thereover. The dopant diffusion barrier layer 104 is illustratively InAlAs and is undoped. Layer 105 of the illustrative mesa 100 is p-type InP. Conventionally, the p-type dopant is zinc, although others such as Be, Mg or Cd can be used in this capacity. The current blocking layers 106 are exemplary iron doped InP (InP(Fe)). Layer 107 comprises one layer of the exemplary dual inter-diffusion barrier layer 109, and is illustratively n-type InP. The second layer 108 of the dual inter-diffusion barrier layer is illustratively undoped InAlAs.

As stated, the InAlAs layers 104, 108 are illustrative, and other materials may be used as dopant diffusion barrier materials to prevent dopants from diffusing out of layer 105 and into layers 103 and 106. The alternative materials would be chosen to suitably block the dopant diffusion, while not forming a parasitic pn junction, for reasons as described above. Moreover, the n-InP layer 107 is illustrative and other materials could be used to accomplish the diffusion blocking of dopants out of the current blocking layers 106. Alternative materials which may be used for layer 107 include, but are not limited to n-InGaAsP, n-InGaAs, or n-InAlAs. Again, alternative materials used as diffusion blocking layers in this capacity would be chosen to suitably block dopant diffusion, while not adding a parasitic capacitance component nor a parasitic pn junction. In summary, it is clear that other suitable materials may be used for diffusion barrier layers 104, 107 and 108 depending on the materials used to form the device and the dopants employed in the various layers.

In the exemplary embodiment shown in FIG. 1, undoped InAlAs is used illustratively for the diffusion barrier layers 104, 108. Applicants have found that this material acts as a very good diffusion barrier for preventing p-type dopants, such as zinc, from diffusing out of layer 105 and into layers 103 and 106. Moreover, the semi-insulating InAlAs is undoped. Therefore, it will not form a pn junction with a p-type layer, such as the p-type cladding layer 105. While the iron doped InP current blocking layer is often used in optoelectronic devices, it is possible that the undoped semi-insulating InAlAs could be used instead of the iron doped InP. In such an embodiment, not shown, the n-type InP layer 107 would not be necessary.

The present invention is applicable to a variety of optoelectronic devices. Illustrative devices include, but are not limited to, semiconductor lasers, modulators and detectors. As is known heterojunctions are used in these devices. A wide variety of materials, to include III-V semiconductors may be used to fabricate the heterostructure device of the present invention. For example, materials that may be used to form the heterostructure from layers 102,103 and 105, include, but are not limited to, GaAs, GaP, InGaAsP, and InGaAs. The active layer 103 may incorporate a single intrinsic or a single quantum well layer, depending on the ultimate device sought. Moreover, it is clear that multiple heterojunction structures such as superlattice structures, or multi-quantum well (MQW) structures, may be used for the active layer. Materials to include those listed above, and others within the purview of one of ordinary skill in the art may be employed in this capacity. The particular materials chosen for layers 102,103 and 105, as well as their chosen stoichiometry varies depending on device application and desired characteristics. Such choices of materials and stoichiometry would be within the purview of one of ordinary skill in the art. Of course, these various materials may use a variety of dopants known to one of ordinary skill in the art.

The fabrication of the exemplary dual-layer interdiffusion barrier layer begins with the growth of layer 107. The exemplary InAlAs layer 108 is illustratively grown by metal organic vapor phase epitaxy (MOVPE) although other techniques may be used. In the fabrication of InAlAs layer 108, applicants have discovered that in order grow the layer along the side walls 109 of the mesa, it is advantageous to carry out the growth step at a relatively low temperature. By carrying out this growth step at a lower temperature, several advantages may be realized. First, the layer 108 is more uniformly deposited along the sidewalls 109 and lower surfaces 110, which may be of differing crystalline orientations. Secondly, the layer 108 may be made thicker, which aids in current confinement. Finally, the InAlAs layer grown at lower temperature is more resistive which is advantageous for current blocking in buried structure devices. In this step, the growth may be carried out at approximately 500° C.–600° C. The exemplary layer 108 of InAlAs has an illustrative thickness in the range of 300 Å–3000 Å, which effectively allow the blocks p-dopants from layer 105 into the current confinement layer 106. Contrarily, when the growth of the p-type dopant blocking layer is substantially planar, for example when growing layer 104, a relatively high temperature MOVPE step may be used. This fosters the growth of a less resistive, thinner layer of InAlAs 104. The lower resistivity of this layer 104 is advantageous as it does not significantly impede current flow. In this embodiment, the growth of layer 104 may be carried out at approximately 600° C.–65° C. A planar layer 104, exemplary InAlAs layer is illustratively 300–1000 Angstroms thick to suitably block zinc diffusion into the active layer 103. The thickness of layer is chosen to effectively block the diffusion of p-dopants (such as Zn) into the active layer 103, but not so thick as to impede current flow.

In the same way that layer 104 prevents diffusion of p-type dopants from the p-type cladding layer 105 into the active layer 103, layer 108 prevents p-type dopants from diffusing from layer 105 into the current confinement layer 106. Again, layer 108 does not form a parasitic pn junction. Accordingly, its use avoids deleterious effects such as leakage current, discussed above. Moreover, this layer 108 does not add parasitic capacitance to the device. The n-type InP layer 107 acts a diffusion barrier for iron dopants in the semi-insulating burying layer 106. This layer 107 is preferably thin, illustratively 50–500 Angstroms, with a relatively low concentration of dopants, illustratively $10^{16}$–$10^{8}$. Accordingly, the iron diffusion barrier is suitably established with layer 107, but by virtue of the relative low dopant concentration and the relatively thin layer, the parasitic capacitance is significantly avoided. Finally, because layer 107 is not in contact with a p-type layer such as p-cladding layer 105, the parasitic pn junction of prior techniques is avoided.

Figure 2:
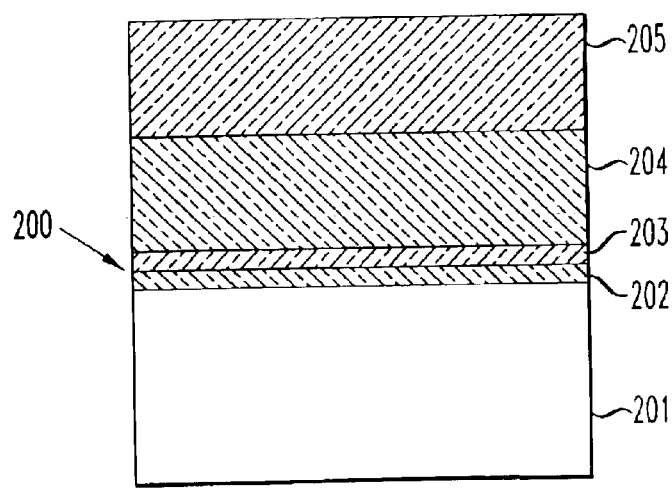
FIG. 2 is a cross sectional view showing the dual dopant diffusion barrier layer in an exemplary embodiment of the present invention.

Turning to FIG. 2, another embodiment of the invention of the present disclosure is shown. In the illustrative embodiment shown in FIG. 2, a multi-layer inter-diffusion barrier layer 200 including layers 202 and 203 is disposed over a substrate 201. Another layer 204 is disposed over the inter-diffusion barrier layer. In the embodiment in FIG. 2, inter-diffusion of dopants is prevented between layers 201 and 204. Illustratively, the lower layer 201 (or the substrate layer) is semi-insulating iron-doped InP. The layer 204 in this illustrative embodiment is a p-type layer of InP; layer 202 is a thin layer (illustratively 50–500 Angstroms) of n-type layer of InP which serves to prevent iron dopant diffusion out of the substrate 201 and into the p-type layer 204. The layer 203 is exemplary InAlAs having a thickness in the illustrative range of 300–2000 Angstroms. This layer 203 prevents the diffusion of p-type dopants out of layer 204 without the formation of parasitic pn junction, as discussed in detail in connection with FIG. 1 above. Moreover, for reasons very consistent with those discussed above in connection with the multi-layer inter-diffusion barrier of FIG. 1, the inter-diffusion barrier made up of layers 202 and 203 of FIG. 2, does not significantly contribute to parasitic capacitance in the structure shown in FIG. 2.

Clearly, there are device structures wherein the substrate would be a p-type layer with a layer of semi-insulating material would be disposed thereover. In other words, illustratively layers 201 and 204 in FIG. 2 would be transposed. In this case, the ordering of the multi-layer dopant barrier layer 200 would be changed. In keeping with the discussion of the embodiment of FIG. 1 discussed above, this would require layer 203 to be one that would block diffusion of dopants from the semi-insulating layer, while layer 202 would be one to prevent p-type dopant diffusion out of the substrate. For example, if layer 204 were InP(Fe), n-InP could be used for layer 203; and if the substrate 201 were p-type InP, layer 202 could be undoped InAlAs. Because the illustrative materials and the fabrication of the structure is virtually identical to that described in connection with the embodiment of FIG. 1, the specific details thereof will be foregone at this point in the interest of brevity of discussion.

The invention having been described, it is clear that modifications and variations will be readily apparent to one having ordinary skill in the art. To this end, these modifications include modifications of materials, structures and devices in keeping with the described invention, a multi-layer dopant diffusion barrier which blocks dopant diffusion without creating parasitic pn junctions and/or increasing parasitic capacitance. To the extent that such variations and modifications are within the purview of one of ordinary skill in the art, such are deemed within the scope of the present invention

What is claimed:

1. An optoelectronics device, comprising:
   a doped layer; and
   a dopant barrier located between said doped layer and a layer, wherein said dopant barrier includes at least two layers and does not form a pnjunction with said doped layer.

2. An optoelectronic device as recited in claim 1, wherein said at least two layers further comprise a first dopant barrier layer and a second dopant barrier layer.

3. An optoelectronic device as recited in claim 2, wherein said layer is a current confinement layer.

4. An optoelectronic device as recited in claim 1, wherein said layer is a substrate.

5. An optoelectronic device as recited in claim 3, wherein said first dopant barrier layer is adjacent said current confinement layer and said second dopant barrier layer is adjacent said doped layer.

6. An optoelectronic device as recited in claim 5, wherein said first dopant barrier layer is n-InP and said second dopant barrier layer is undoped InAlAs.

7. An optoelectronic device as recited in claim 6, wherein said current confinement layer is InP(Fe).

8. An optoelectronic device as recited in claim 1, wherein said layer is undoped InAlAs.

9. An optoelectronic device as recited in claim 3, wherein said current confinement layer is disposed on either side of a mesa.

10. An optoelectronic device as recited in claim 1, wherein said doped layer is a substrate and said layer is a semi-insulating layer.

11. An optoelectronics device, comprising:
    a mesa having a substrate, a first dopant barrier having at least two layers disposed over said substrate; and
    at least one layer disposed over said first dopant barrier, said first dopant barrier not forming a p-n junction with said substrate or said at least one layer.

12. An optoelectronic device as recited in claim 11, wherein a second dopant barrier is disposed between said mesa and a current confinement layer.

13. An optoelectronic device as recited in claim 12, wherein said second dopant barrier further comprises a first layer and a second layer.

14. An optoelectronic device as recited in claim 12, wherein said first layer is adjacent said current confinement layer and said second layer is adjacent said mesa.

15. An optoelectronic device as recited in claim 14, wherein said second layer does not from a pn junction with said substrate of said at least one layer.

16. An optoelectronic device as recited in claim 11, wherein said one of said at least two layers is undoped InAlAs.

17. An optoelectronic device as recited in claim 12, wherein said second dopant barrier includes a layer InAlAs.

18. An optoelectronic device as recited in claim 12, wherein said second dopant barrier includes a layer of n-InP.

19. An optoelectronic device as recited in claim 12, wherein said current confinement layer is InP(Fe) and one of said at least one layers is p-doped InP.

20. An optoelectronic device as recited in claim 19, wherein said p-doped InP is doped with Zn.

* * * * *